United States Patent
Yang et al.

(10) Patent No.: US 7,661,778 B2
(45) Date of Patent: Feb. 16, 2010

(54) FAST MOUNTING MECHANISM FOR A TELESCOPING SLIDE

(75) Inventors: Shun-Ho Yang, Kaohsiung Hsien (TW); Shih-Long Hwang, Kaohsiung Hsien (TW); Chun-Chiang Wang, Kaohsiung Hsien (TW)

(73) Assignee: King Slide Works Co., Ltd., Kaohsiung Hsien (TW)

( * ) Notice: Subject to any disclaimer, the term of this patent is extended or adjusted under 35 U.S.C. 154(b) by 0 days.

(21) Appl. No.: 12/292,053

(22) Filed: Nov. 12, 2008

(65) Prior Publication Data

US 2009/0072689 A1 Mar. 19, 2009

Related U.S. Application Data

(63) Continuation of application No. 11/285,042, filed on Nov. 23, 2005, now abandoned.

(51) Int. Cl.
*A47B 95/00* (2006.01)
(52) U.S. Cl. .................................. 312/333; 312/334.1
(58) Field of Classification Search ................ 312/333, 312/334.1, 348.1, 348.2
See application file for complete search history.

(56) References Cited

U.S. PATENT DOCUMENTS

| | | | |
|---|---|---|---|
| 4,331,369 A * | 5/1982 | Lazar et al. ................ 384/23 |
| 5,632,542 A * | 5/1997 | Krivec ...................... 312/334.7 |
| 6,123,314 A * | 9/2000 | Steele ........................ 248/681 |
| 6,209,979 B1 * | 4/2001 | Fall et al. .................. 312/330.1 |
| 6,375,290 B1 * | 4/2002 | Lin et al. ................ 312/334.46 |
| 6,588,866 B2 * | 7/2003 | Cheng ...................... 312/334.7 |
| 6,601,933 B1 * | 8/2003 | Greenwald .................... 312/333 |
| 6,817,685 B2 * | 11/2004 | Lammens .............. 312/334.47 |
| 6,851,774 B2 * | 2/2005 | Chen et al. ............. 312/334.47 |
| 2001/0040203 A1 * | 11/2001 | Brock et al. ............ 248/222.11 |
| 2002/0089274 A1 * | 7/2002 | Liang et al. ............. 312/334.44 |
| 2003/0141791 A1 * | 7/2003 | Dubon et al. ................ 312/333 |
| 2004/0108797 A1 * | 6/2004 | Chen et al. ............... 312/334.7 |
| 2005/0088069 A1 * | 4/2005 | Greenwald et al. .......... 312/333 |

* cited by examiner

*Primary Examiner*—Janet M Wilkens
*Assistant Examiner*—Timothy M Ayres
(74) *Attorney, Agent, or Firm*—Rosenberg Klein & Lee

(57) ABSTRACT

A fast mounting mechanism for a telescoping slide, the slide includes an inner rail to receive the mounting of a drawer or the like and an outer rail. The inner rail comprises mounting holes. Each mounting hole contains a vertical channel and a horizontal channel connecting through each other. A positioning member and a release member are provided on the inner. side of the inner rail adjacent to one of the mounting holes. The positioning member has a first end locked to the inner side of the inner rail and a second end provided with a protruding bit facing the horizontal channel of the mounting hole. The release member disposed on the inner rail slides in relation with and pushes against the positioning member for its protruding bit to move away in opposite direction relatively to the inner side of the inner rail.

6 Claims, 12 Drawing Sheets

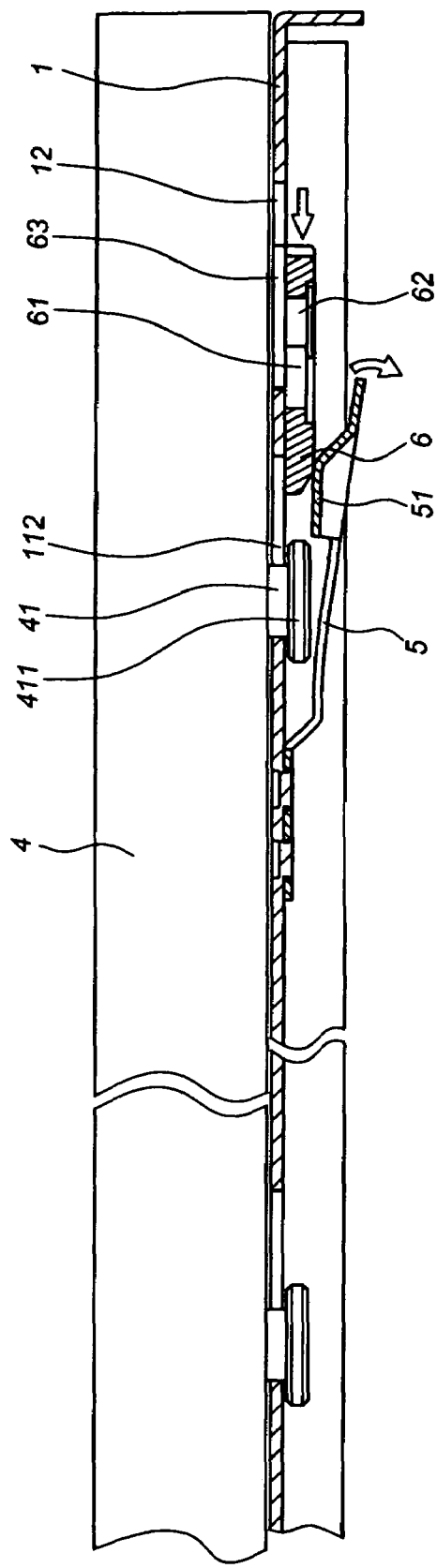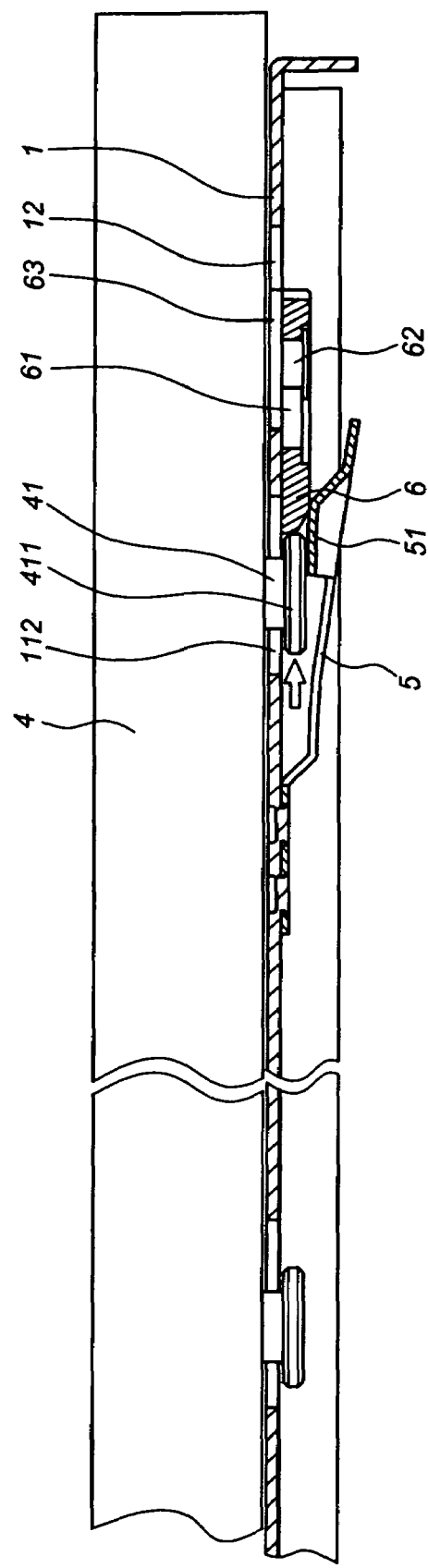

FAST MOUNTING MECHANISM FOR A TELESCOPING SLIDE

CROSS REFERENCE TO RELATED APPLICATIONS

This is a continuation application of application Ser. No. 11/285,042 filed on Nov. 23, 2005, now abandoned. This application claims only subject matter disclosed in the parent application and therefore presents no new matter.

BACKGROUND OF THE INVENTION (a) Field of the Invention

The present invention relates to a fast mounting mechanism for a telescoping slide, and more particularly to one that allows a drawer or the like to be fast mounted and secured in place and easily released from secured position.

(b) Description of the Prior Art

In addition to using screws or similar locking members to respectively fasten two inner rails of both left and right slides to both sides of a wooden drawer or the like, or pins are provided to be incorporated with insertion holes and insertion plates of the telescoping slides in case of metal drawer or the like for mounting telescoping slides to the drawer or the like, there are more convenient means available from the prior art commonly observed in the cabinet products for computer servers and disclosed in U.S. Pat. Nos. 4,331,369, 5,632,542, 6,123,314, 6,209,979 B1, 6,588,866 B2, and 6,601,933 B1, as well as U.S. patent application Nos. US 2001/0040203 A1, US 2003/0141791 A1, US 2004/0108797 A1, US 2005/0088069 A1, and Taiwan Patent Publication No. 538716 [i.e., US 2004/0108797 A1].

In all those prior arts cited above, it becomes very troublesome to remove the drawer or the like from the slides since it takes a user to use a hand tool or his fingers to turn an elastic tongue or a dancer adapted to hold against protruding bolts respectively provided on both sides of the drawer or the like without leaving the bolts until those bolts are removed. When the slides have been already mounted to a cabinet, the user must have one hand turning the elastic tongue or the dancer and the other hand removing the bolts from the drawer or the like. Furthermore, the operation of human resources is compromised if the drawer or the like is a heavy server of computer. In such case, it usually takes two persons to get the job done.

SUMMARY OF THE INVENTION

The primary purpose of the present invention is to provide a fast mounting mechanism for a telescoping slide to overcome those shortcomings found with the prior art. To achieve the purpose, the slide comprises an inner rail and an outer rail as a minimum. To incorporate with the drawer or the like, the inner rail is provided with at least two mounting holes, and a positioning member and a release member closer to one of the mounting holes. The mounting hole contains a vertical channel and a horizontal channel connecting through each other. The positioning member is a resilient strap with a first end locked to the inner side of the inner rail and a second end provided with a protruding bit in the direction of facing the horizontal channel of the mounting hole. The release member is disposed on the inner side of the inner rail to slide in relation with and push against the positioning member for the protruding bit to move away in opposite direction in relation to the inner side of the inner rail. Bolts are disposed on each side of the drawer or the like corresponding in position to the mounting holes. Each bolt has a head in a diameter larger than that of the bolt. Accordingly, when the drawer or the like has its bolt to snap into the mounting hole, and then slides into the horizontal channel of the mounting hole, the head of the bolt automatically holds against and is interlocked in position with the protruding bit of the positioning member. To remove the drawer or the like, slide the release member towards and holing against the positioning member to release the head of the bolt from the protruding bit; in turn the bolt retreats from the mounting hole while pushing the release member back to its original place.

Accordingly, when compared to the prior art, the present invention provides the following advantages:

1. The release member maintains the status of sliding to hold against the positioning member without continuing to apply force from the fingers for the user to have both hands free to hold the drawer or the like to directly remove the drawer or the like by moving its bolt.
2. While moving the bolt out of the mounting hole to remove the drawer or the like from the slide, the bolt automatically pushes the release member to its original place without using the fingers to push the release member. Consequently, if mounting the drawer or the like to the slide is desired once again, the positioning member is ready to automatically retain the drawer or the like in position upon snapping the bolt into the mounting hole.

BRIEF DESCRIPTION OF THE DRAWINGS

FIG. 8 is a schematic view showing operation of a release member of the preferred embodiment of the present invention.

FIG. 9 is another schematic view showing operation of the release member of the preferred embodiment of the present invention.

DETAILED DESCRIPTION OF THE PREFERRED EMBODIMENTS

Figure 1:
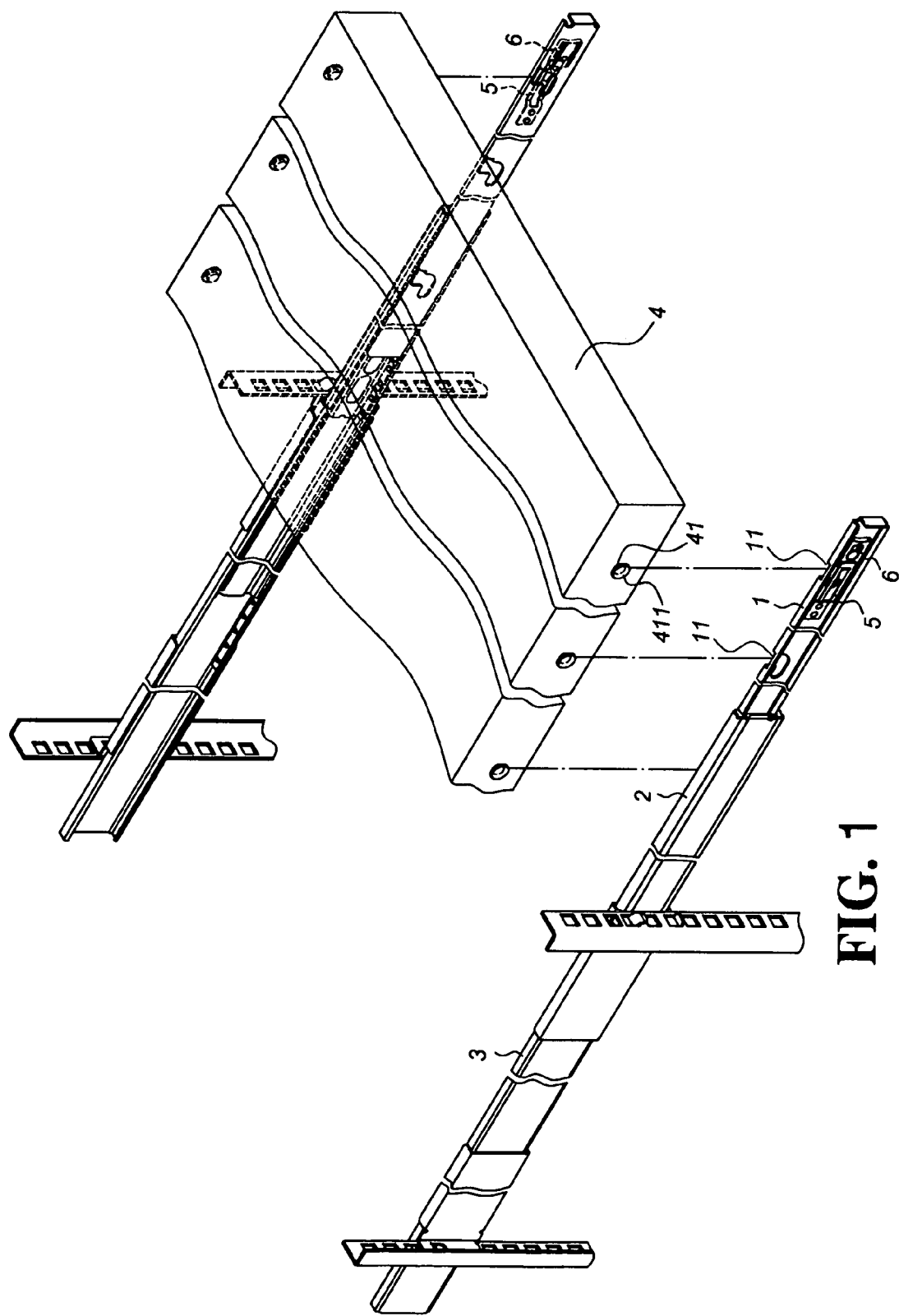
FIG. 1 is an exploded view of a preferred embodiment of the present invention.

Referring to FIG. 1 for a preferred embodiment of a fast mounting mechanism of the present invention adapted to telescoping slides for installation of a drawer or the like, a drawer (4) allows to be fully pulled out by means of slides. The slide includes an inner rail (1), a middle rail (2) and an outer rail (3); or alternatively, the slide (1) is composed of an inner rail and an outer rail to allow the drawer to be partially pulled out. However, either the three- or two-section configuration of the slide is a general practice and thus is not illustrated herein; furthermore, the present invention is not essentially characterized in the construction of the slide. The present invention is characterized in the inner rail (1) to receive installation of the drawer (4).

Figure 2:
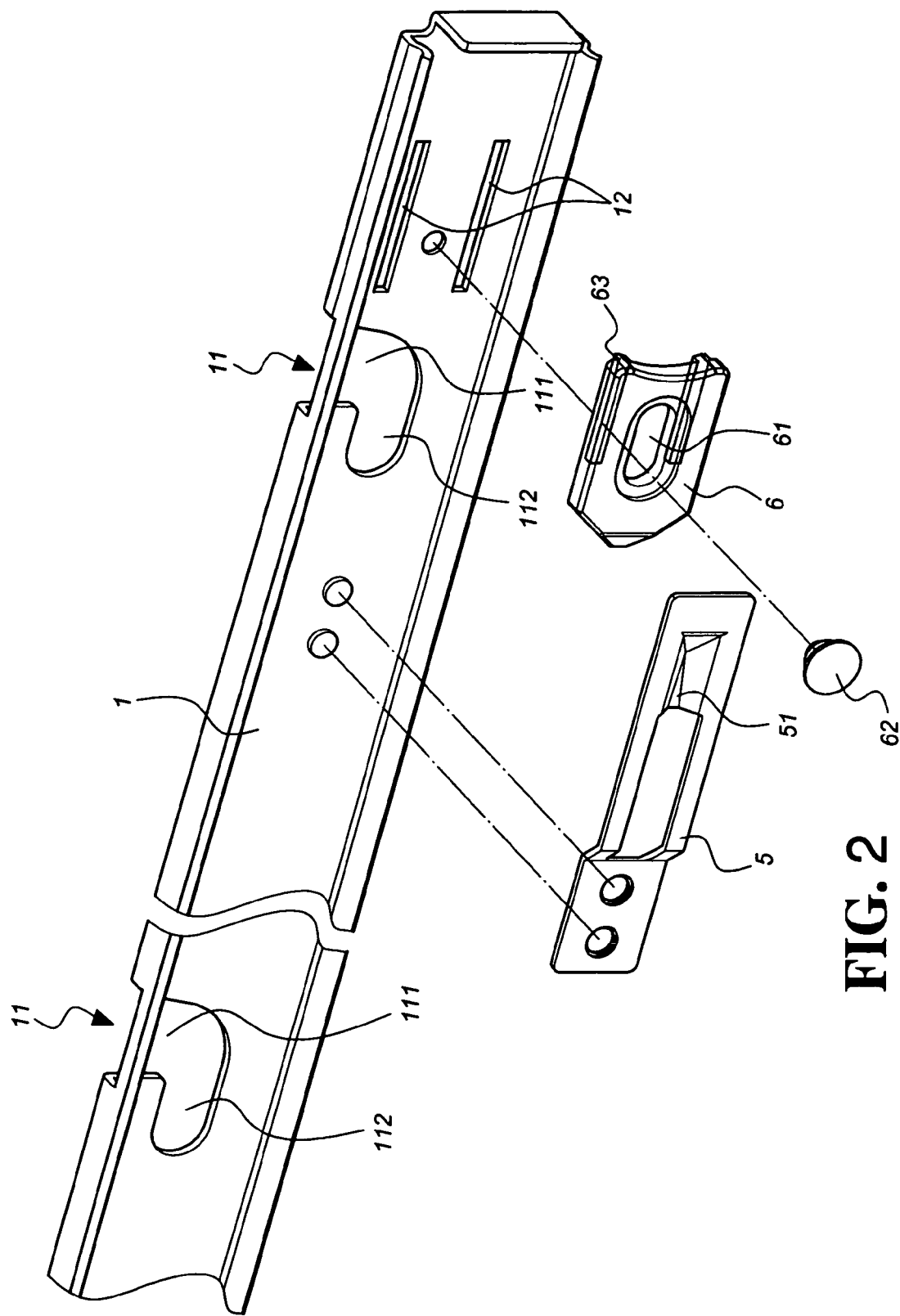
FIG. 2 is an exploded view of the primary construction of the preferred embodiment of the present invention.
Figure 3:
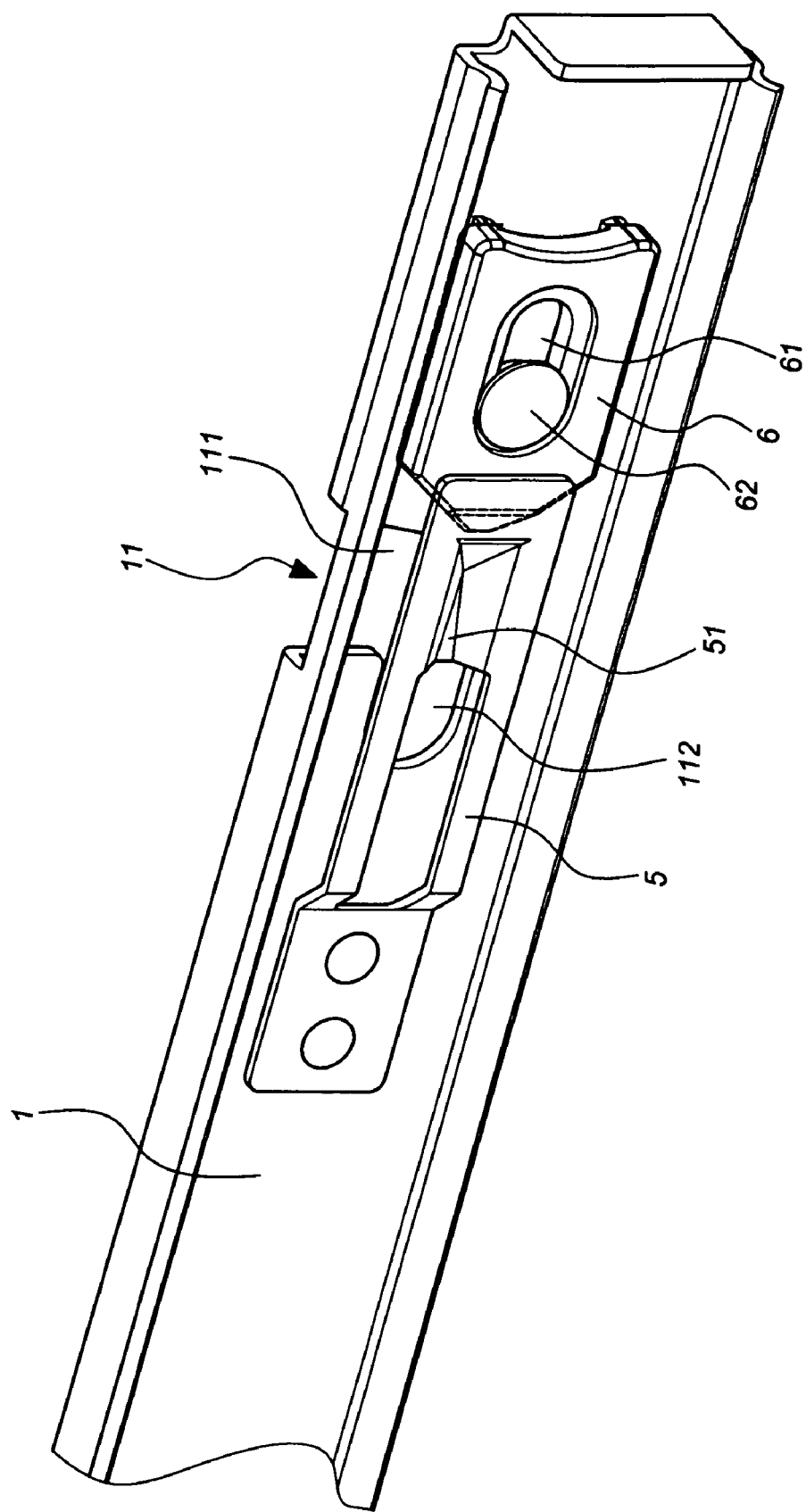
FIG. 3 is a schematic view showing an assembly of the primary construction of the preferred embodiment of the present invention.

As illustrated in FIGS. 2 and 3, the inner rail (1) comprises at least two mounting holes (11), and a positioning member (5) and a release member (6) located adjacent to one of the mounting holes (11). The mounting hole (11) includes a vertical channel (111) and a horizontal channel (112) connecting through each other.

The positioning member (5) is a resilient strap block and has a first end locked to an inner side of the inner rail (1) and a second end provided with a protruding bit (51) in relation to the horizontal channel (112) of the mounting hole (11).

The release member (6) is disposed on the inner side of the inner rail (1) to slide in relation with and push against the positioning member (5) for the protruding bit (51) of the positioning member (5) to move away from the inner side of the inner rail (1). Furthermore, a lateral chute (61) is disposed to the release member (6) and a pin (62) penetrates through the lateral chute (61) to be fastened to the inner rail (1). A pair of guide blocks (63) is provided on the back of the release member (6) and a pair of guide channels (12) is disposed on the inner rail (1) to receive insertion of the guide blocks (63) so to guide the release member (6) to engage in lateral movement.

Bolts (41) are provided on each side of the drawer (4) corresponding in position to the mounting holes (11). Each bolt (41) has a head (411) in a diameter larger than that of the bolt (41).

Figure 4:
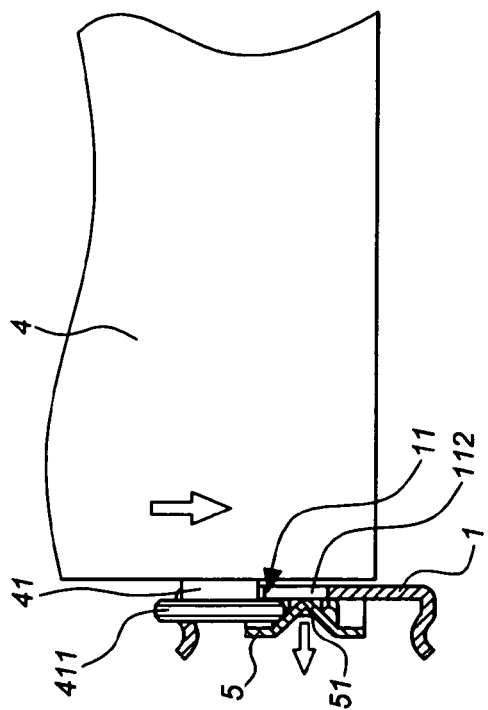
FIG. 4 is a schematic view showing the mounting procedure of the preferred embodiment of the present invention.
Figure 5:
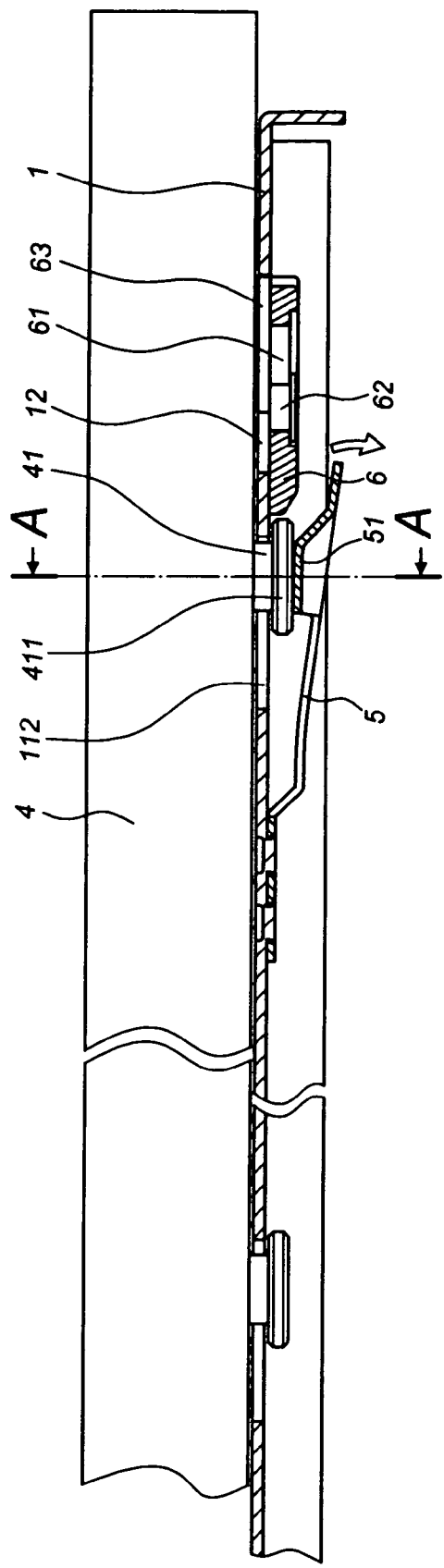
FIG. 5 is another schematic view showing the mounting procedure of the preferred embodiment of the present invention.
Figure 6:
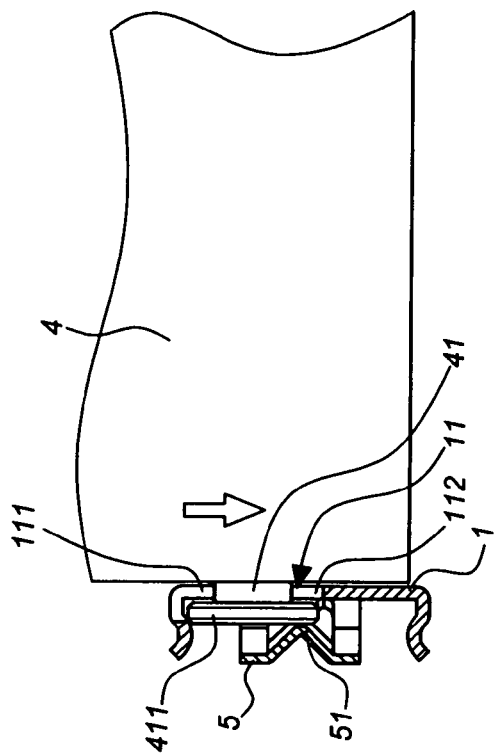
FIG. 6 is another schematic view showing the mounting procedure of the preferred embodiment of the present invention.
Figure 7:
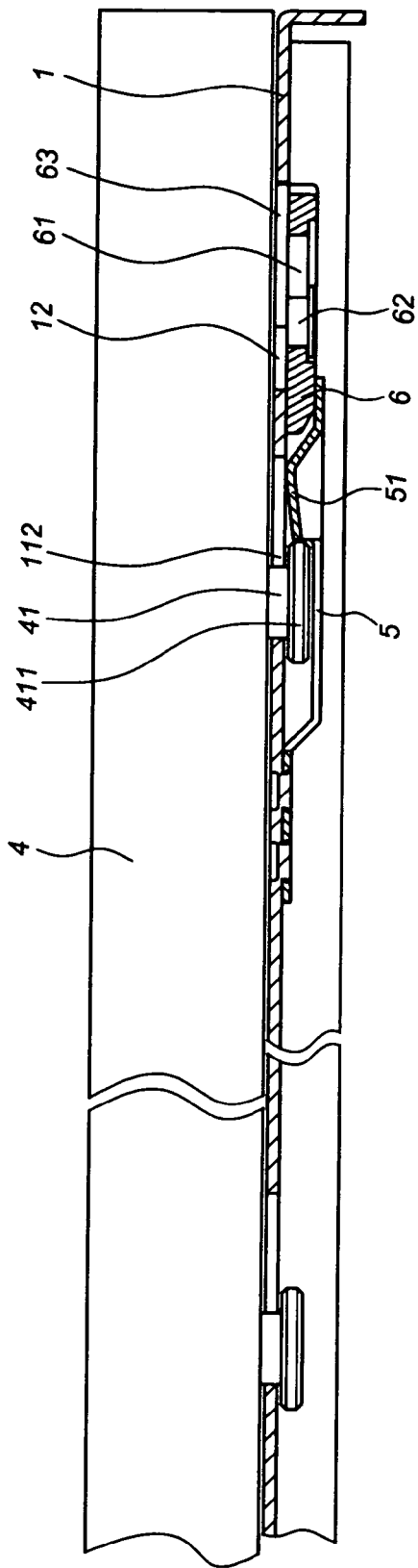
FIG. 7 is a schematic view showing completion of the mounting of the preferred embodiment of the present invention.

When the drawer (4) is snapped with its bolt (41) first into the vertical channel (111) of the mounting hole (11) of the inner rail (1) as illustrated in FIGS. 4, 5, and 6, the head (411) of the bolt (41) is placed on the inner side of the inner rail (1) to automatically push against the protruding bit (51) of the positioning member (5) before sliding into the horizontal channel (112) of the mounting hole (11). The positioning member (5) returns, as illustrated in FIG. 7, when the head (411) of the bolt (41) slides to where behind the protruding bit (51) for the protruding bit (51) to hold against the head (411) so to secure the inner rail (1) and the drawer (4).

Figure 10:
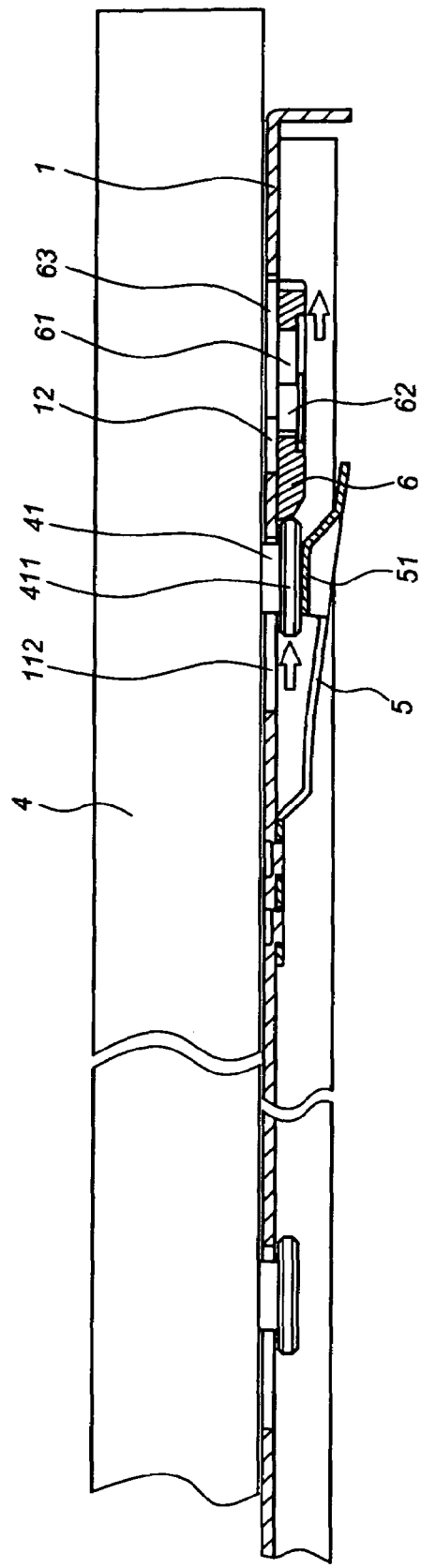
FIG. 10 is another schematic view showing operation of the release member of the preferred embodiment of the present invention.

To remove the drawer (4), the release member (6) is pushed to slide towards the positioning member (5) to push the protruding bit (51) from the head (411) of the bolt (41), as illustrated in FIG. 8. In turn, the bolt (41) of the drawer (4) retreats from the horizontal channel (112) of the mounting hole (11) and upwardly moves away along the vertical channel (111) to allow removal of the drawer (4), as illustrated in FIGS. 9 and 10. While being removed, the head (411) of the bolt (41) pushes the release member (6) to its original place to facilitate assembly of the drawer (4) next time.

Figure 11:
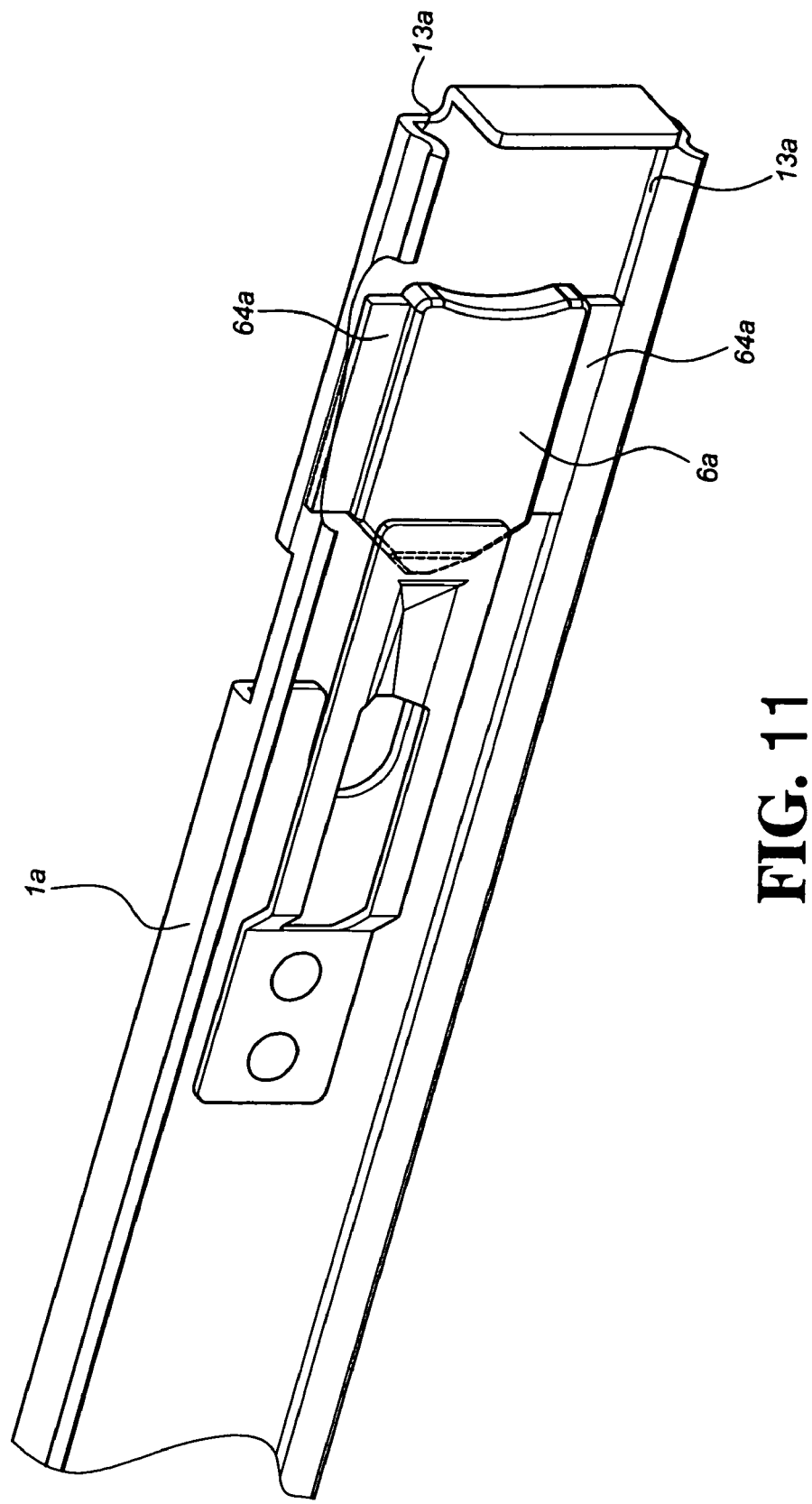
FIG. 11 is a schematic view of a local change made to the construction of the release member of the preferred embodiment of the present invention.

The release member (6) provided on the inner side of the inner rail (1) is guided to travel laterally; or alternatively, as illustrated in FIG. 11, a pair of wings (64a) is provided at respective sides of a release member (6a) to be inserted into a pair of grooves (13a) disposed on both inner sides of an inner rail (1a) to achieve the same purpose of having the release member (6a) to laterally travel on the inner side of the inner rail (1a).

Figure 12:
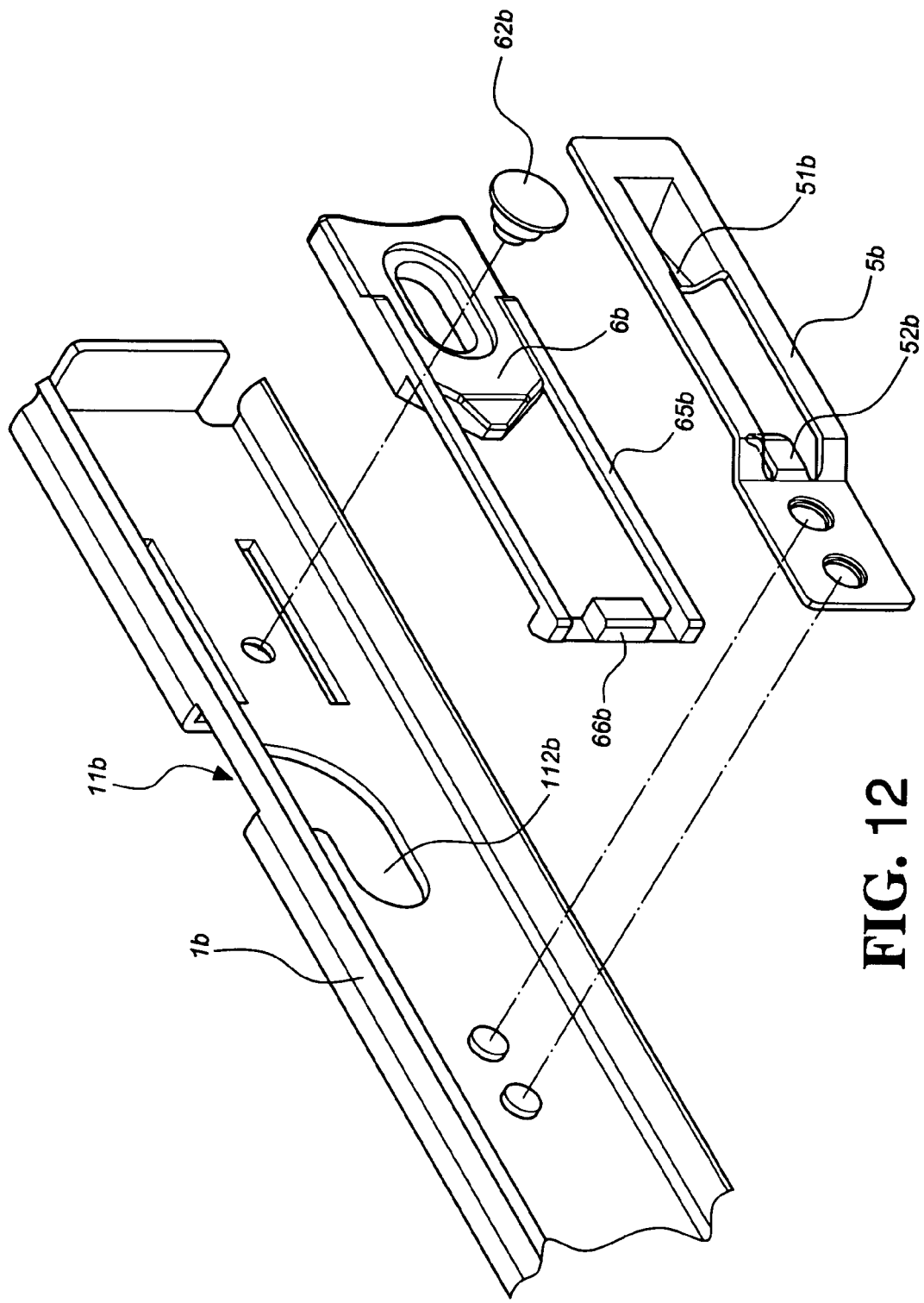
FIG. 12 is an exploded view of the primary construction of another preferred embodiment of the present invention.
Figure 13:
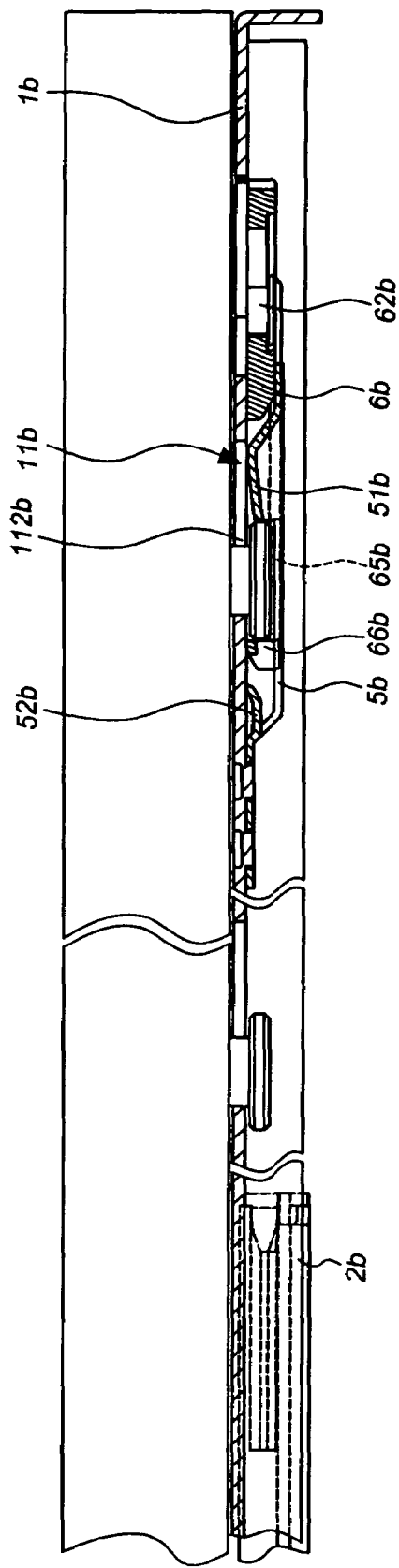
FIG. 13 is a sectional view showing an assembly of the primary construction of another preferred embodiment of the present invention.

Furthermore, the present invention by incorporating the preferred embodiment disclosed above provides a foolproof design as illustrated in FIGS. 12 and 13. A first end of a positioning member (5b) is fixed to an inner side of an inner rail (1b) and a protruding bit (51b) is disposed to a second end of the positioning member (5b) in relation to a horizontal channel (112b) of a mounting hole (11b). A protruding member (52b) is disposed at the first end of the positioning member (5b).

A release member (6b) connected with a pin (62b) to the inner side of the inner rail (1b) slides relatively to the positioning member (5b) and pushes the protruding bit (51b) of the positioning member (5b) to move in opposite direction in relation to the inner side of the inner rail (1b). An extension (65b) is disposed to the end of the release member (6b) facing the positioning member (5b) and a push block (66b) is further provided to the front end of the extension (65b).

Figure 14:
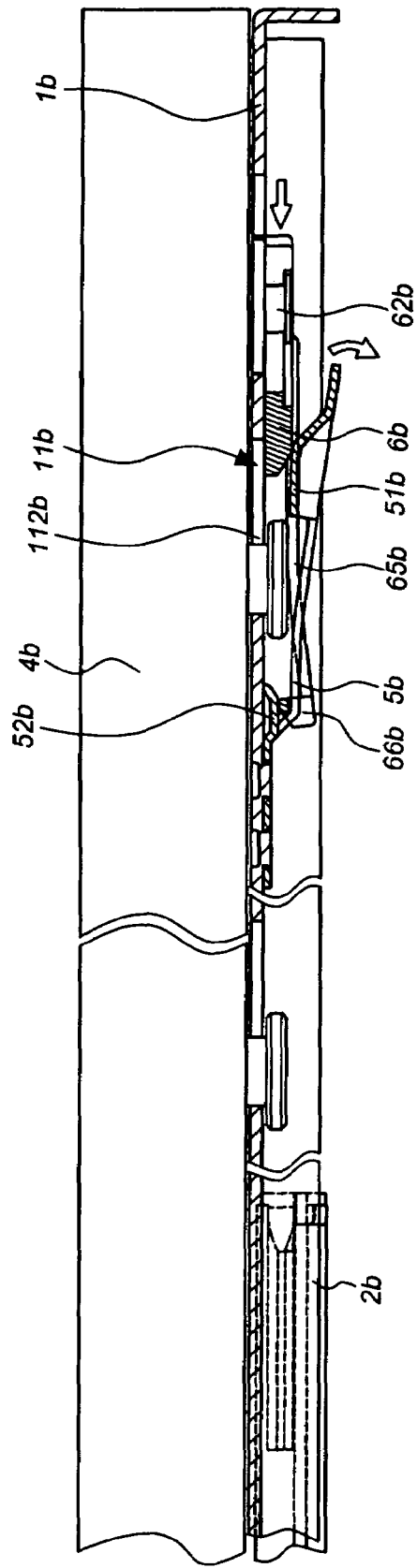
FIG. 14 is a schematic view showing operation of another preferred embodiment of the present invention.
Figure 15:
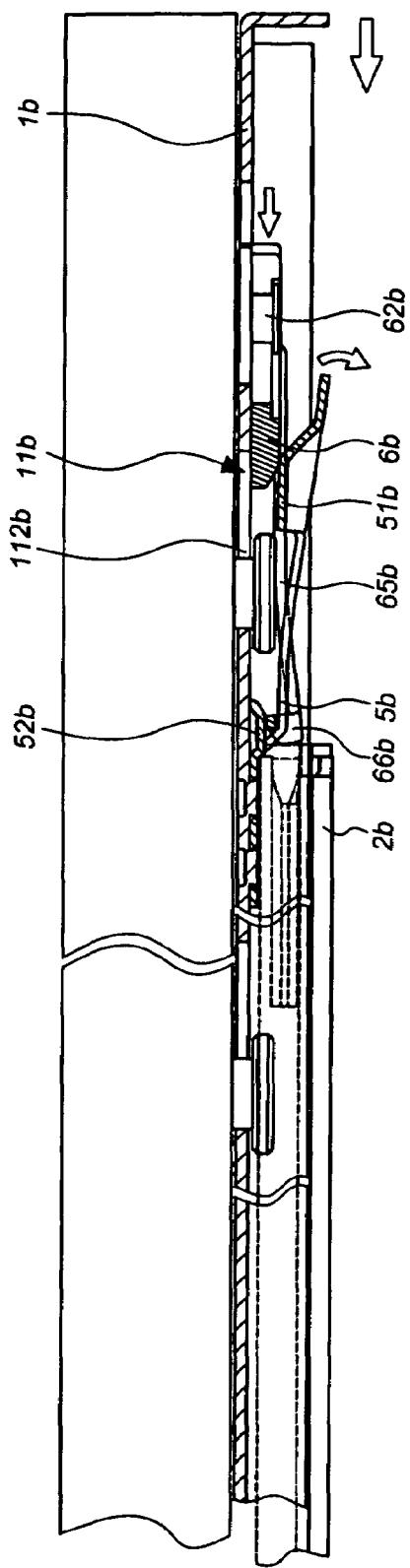
FIG. 15 is another schematic view showing operation of another preferred embodiment of the present invention.
Figure 16:
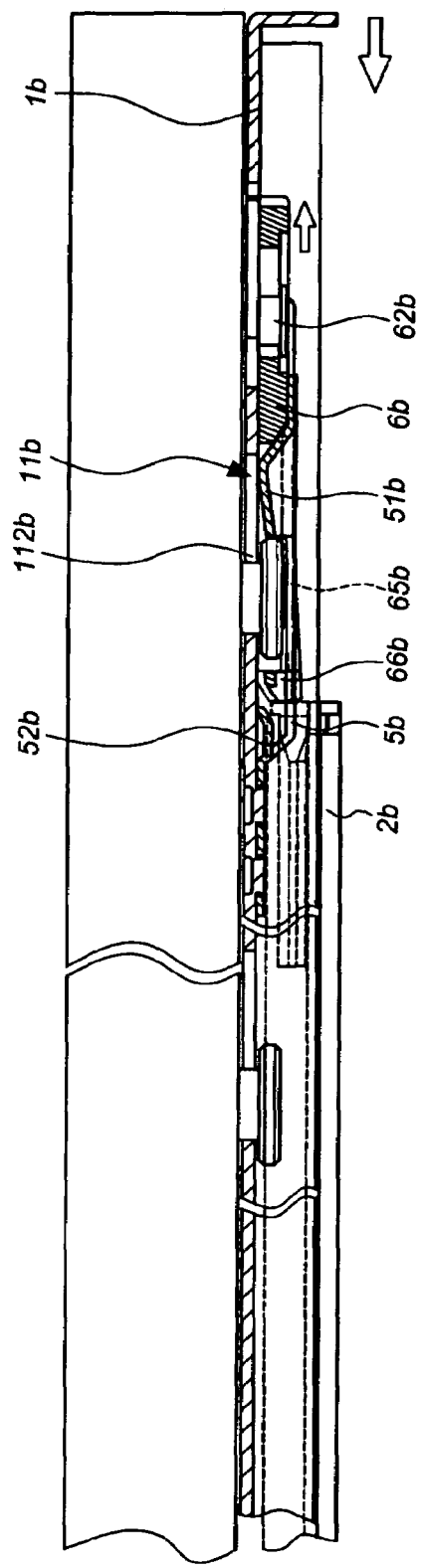
FIG. 16 is another schematic view showing operation of another preferred embodiment of the present invention.
Figure 17:
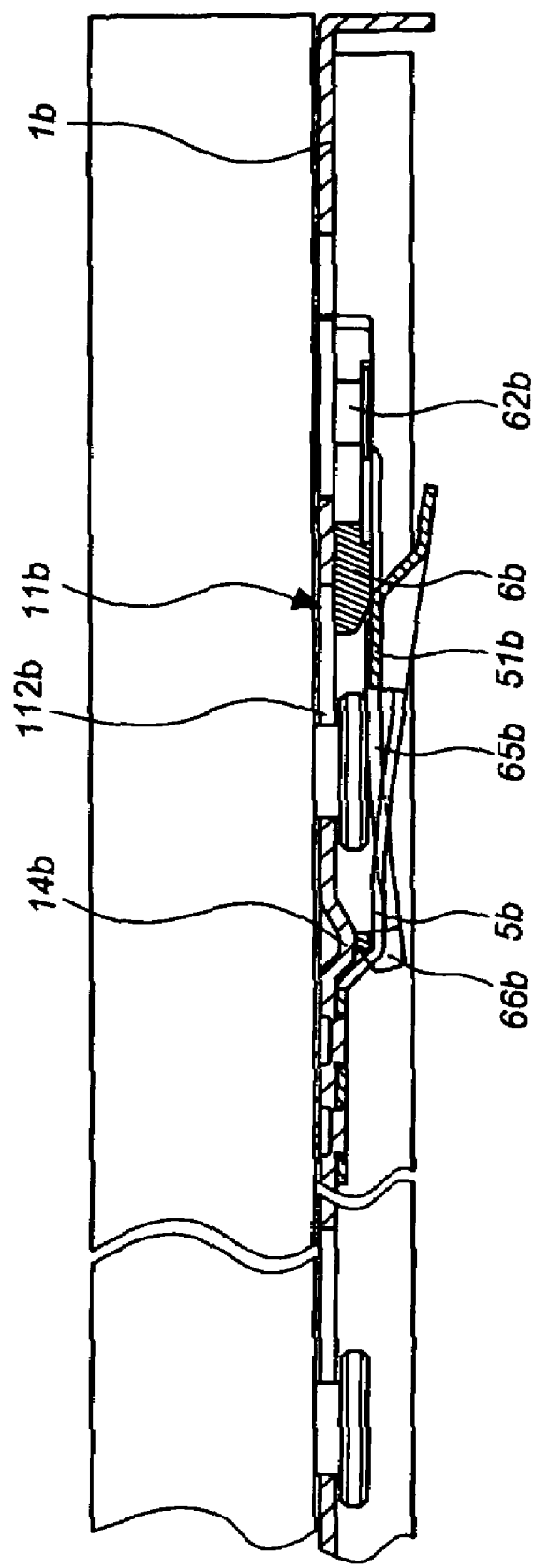
FIG. 17 is a schematic view showing a local change made to another preferred embodiment of the present invention.

When the user pushes by accident the release member (6b) to lift the protruding bit (51b) of the positioning member (5b) and the lifted positioning member (5b) together with the inner rail (1b) is received by a middle rail (2b) as illustrated in FIG. 14, the positioning member (5b) will hit the front end of the middle rail (2b), resulting in deformation and failure of the positioning member (5b). Therefore, the primary purpose of the foolproof design is to solve the problem of failure of the positioning member (5b) due to improper use. As illustrated in FIG. 15, when the release member (6b) is pushed to life the protruding bit (51b), the push block (66b) disposed at the extension (65b) of the release member (6b) slides and rises by sliding against the protrusion member (52b) of the positioning member (5b). Meanwhile, if the lifted positioning member (5b) is received together with the inner rail (1b) into the middle rail (2b) as illustrated in FIG. 16, the front end of the middle rail (2b) will contact the risen push block (66b) of the release member (6b) thus to be pushed back to its original place due to the transmission of the force through the extension (65b). The positioning member (5b) freed from being subject to push by the release member (6b) immediately bounces back and descends without holding against the middle rail (2b) to facilitate the normal retraction of the inner rail (1b) and the middle rail (2b). Alternatively, another protruding bit (14b) is directly formed on the inner side of the inner rail (1b) as illustrated in FIG. 17 to achieve the same purpose for the push block (66b) of the release member (6b) to rise by holding against the protrusion member (52b) of the positioning member (5b).

What is claimed is:

1. A fast mounting mechanism for a telescoping slide comprising:

a middle rail;

a inner rail received in the middle rail, the inner rail having a mounting hole, the mounting hole containing a vertical channel and a horizontal channel connecting through each other;

a positioning member including a first end and a second end, the first end of the positioning member being fixed to the inner rail, the second end of the positioning member being provided with a protruding bit in relation to the horizontal channel of the mounting hole, and a protruding member provided on the positioning member; and a release member disposed on the inner rail to slide in relation with the positioning member, the release member including an extension and a push block disposed at one end of the extension;

wherein the protruding bit of the positioning member to move in opposite direction in relation to the inner rail and the push block of the release member slides and rises by sliding against the protrusion member of the positioning member when the release member is pushed to lift the protruding bit of the positioning member;

wherein one end of the middle rail contacts the risen push block of the release member thus to be pushed back to its original place so that the release member immediately bounces back and descends without holding against the middle rail when the lifted positioning member is received together with the inner rail into the middle rail.

2. The fast mounting mechanism for a telescoping slides of claim 1, wherein the release member comprises a lateral chute, a pin penetrating through the lateral chute to be fixed to the inner rail, and a pair of guide blocks disposed on the back of the release member; and the inner rail being provided with a pair of guide channels to receive insertion of the guide blocks to lead the release member engaging in movement.

3. The fast mounting mechanism for a telescoping slide of claim 1, wherein the release member is formed with a pair of wings at respective sides; the inner rail being provided with a pair of grooves to receive insertion of the wings; and the release member engaging in lateral movement along the inner rail.

4. A fast mounting mechanism for a telescoping slide comprising:

a middle rail;

an inner rail received in the middle rail, the inner rail including a protruding bit and a mounting hole, the mounting hole containing a vertical channel and a horizontal channel connecting through each other;

a positioning member including a first end and a second end, the first end of the positioning member being fixed to the inner rail, the second end of the positioning member being provided with a protruding bit in relation to the horizontal channel of the mounting hole; and a release member disposed on the inner rail to slide in relation with the positioning member, the release member including an extension and a push block disposed at one end of the extension;

wherein the protruding bit of the positioning member to move in opposite direction in relation to the inner rail and the push block of the release member slides and rises by sliding against the protruding bit of the inner rail when the release member is pushed to lift the protruding bit of the positioning member;

wherein one end of the middle rail contacts the risen push block of the release member thus to be-pushed back to its original place so that the release member immediately bounces back and descends without holding against the middle rail when the lifted positioning member is received together with the inner rail into the middle rail.

5. The fast mounting mechanism for a telescoping slide of claim 4, wherein the release member comprises a lateral chute, a pin penetrating through the lateral chute to be fixed to the inner rail, and a pair of guide blocks disposed on the back of the release member; and the inner rail being provided with a pair of guide channels to receive insertion of the guide blocks to lead the release member engaging in lateral movement.

6. The fast mounting mechanism for a telescoping slide of claim 4, wherein the release member is formed with a pair of wings at respective sides; the inner rail being provided with a pair of grooves to receive insertion of the wings; and the release member engaging in lateral movement along the inner rail.

\* \* \* \* \*